(12) United States Patent
Hu et al.

(10) Patent No.: US 6,169,003 B1
(45) Date of Patent: Jan. 2, 2001

(54) METHOD FOR FORMING A MOS DEVICE WITH AN ELEVATED SOURCE AND DRAIN, AND HAVING A SELF-ALIGNED CHANNEL INPUT

(75) Inventors: Chu-Wei Hu, Taichung; Jine-Wen Weng, Hsin-Chu, both of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/375,202

(22) Filed: Aug. 16, 1999

(51) Int. Cl.[7] .................................................. H01L 21/336
(52) U.S. Cl. ..................... 438/299; 438/300; 438/301; 438/302; 438/303; 438/306; 438/197; 438/221; 438/230; 438/585; 438/589
(58) Field of Search ..................... 438/299, 300, 438/301, 302, 303, 306, 197, 221, 230, 585, 589

(56) References Cited

U.S. PATENT DOCUMENTS

| | | | |
|---|---|---|---|
| 5,429,956 | 7/1995 | Shell et al. | 437/29 |
| 5,434,093 | 7/1995 | Chau et al. | 437/41 |
| 5,489,543 | 2/1996 | Hong | 437/41 |
| 5,538,913 | 7/1996 | Hong | 437/44 |
| 5,599,728 | 2/1997 | Hu et al. | 437/44 |
| 5,670,401 | 9/1997 | Tseng | 437/44 |
| 5,677,218 | 10/1997 | Tseng | 437/45 |
| 5,773,348 | 6/1998 | Wu | 438/305 |
| 5,801,075 | 9/1998 | Gardner et al. | 438/197 |
| 5,817,558 | 10/1998 | Wu | 438/291 |

Primary Examiner—John F. Niebling
Assistant Examiner—Jonathan Hack
(74) Attorney, Agent, or Firm—George O. Saile; Stephen B. Ackerman; William J. Stoffel

(57) ABSTRACT

A method of forming a FET with an having a self-aligned pocket implant, comprising the following steps. A substrate is formed having a substrate dielectric layer thereon and a first oxide layer over the substrate dielectric layer. The first oxide layer having an upper surface. A trench is formed through the oxide layer, the substrate dielectric layer, and partially through the substrate. The trench having a bottom and side walls. A second oxide layer is formed along the bottom and said side walls of said trench within the substrate. A dopant is selectively ion implanted into the substrate is achieved to form lightly doped layers adjacent the side walls of the trench within the substrate. A self-aligned channel implant and a pocket implant are ion implanted at predetermined respective depths in the substrate below the trench bottom is achieved. Side-wall spacers on the side walls of the trench are then formed with the side-wall spacers each having a top surface below the upper surface of the first oxide layer. A gate dielectric layer is formed on the bottom of the trench between the side-wall spacers. A planarized gate electrode is formed that has an upper surface substantially coextensive with the upper surface of the first oxide layer. The first oxide layer and the substrate dielectric layer are removed. A dopant is ion implanted into the substrate to form heavily doped layers adjacent the side wall spacers.

15 Claims, 5 Drawing Sheets

METHOD FOR FORMING A MOS DEVICE WITH AN ELEVATED SOURCE AND DRAIN, AND HAVING A SELF-ALIGNED CHANNEL INPUT

FIELD OF THE INVENTION

The present invention relates generally to methods of forming metal oxide semiconductor field effect transistors (MOSFET) devices and specifically to those having an elevated source and drain, and more pointedly to those having a self-aligned channel implant.

BACKGROUND OF THE INVENTION

As integrated circuits (IC) become smaller and smaller through miniaturization, their decreased dimensions have presented additional problems and difficulties. For example, as their horizontal dimensions shrink to fit more and more field effect transistors (FET), for example, onto a single IC chip, the concomitant FET vertical dimensions also shrink channel lengths under the gate electrode which creates so-called short channel effects. Examples of short channel effects are: channel-length modulation, velocity saturation, mobility degradation, source/drain resistance, punchthrough, drain induced barrier lowering, and dependence of threshold voltage ($V_t$) on device geometry. Techniques have been developed to counter these short channel effects. For example anti-punchthrough buried channel implants are placed in the substrate to counteract punchthrough effects.

For example, U.S. Pat. No. 5,773,348 to Wu describes a method of fabricating a short-channel MOS device that may include an anti-punchthrough stopping implantation to prevent punchthrough between the source and drain.

U.S. Pat. No. 5,538,913 to Hong describes a process for fabricating a MOS transistor having a full-overlap LDD structure that is suitable for semiconductor circuit integration and provides improved operational characteristics.

U.S. Pat. No. 5,434,093 to Chau et al. describes a method for forming narrow length transistors by the use of spacers within a trench formed in a first layer over a semiconductor substrate. A self-aligned punchthrough stopper may be implanted beneath the channel in the semiconductor substrate to raise the source/drain punchthrough voltage of the transistor and to reduce the capacitance between the source and the drain.

U.S. Pat. No. 5,489,543 to Hong describes a method employing self-alignment to form a metal oxide semiconductor (MOS) structure having a localized anti-punchthrough region which decreases the junction capacitance of source/drain regions, thereby helping to increase the operational speed of the resulting MOS transistors.

U.S. Pat. No. 5,429,956 to Shell et al. describes a structure and method for fabricating a FET having an improved drain to source punchthrough properties by the use of a self-aligned anti-punchthrough implant channel under and aligned to the FET's gate electrode.

U.S. Pat. No. 5,817,558 to Wu describes a semiconductor processing method for forming self-aligned T-gate LDD device having an ultra-short recessed gate and an anti-punchthrough layer.

U.S. Pat. No. 5,677,218 to Tseng describes a method of forming a local threshold voltage ion implantation to reduce the junction capacitance in a semiconductor device.

U.S. Pat. No. 5,599,728 to Hu et al. describes a method of making a self-aligned high speed MOSFET device having a punchthrough stopper region.

U.S. Pat. No. 5,670,401 to Tseng describes a process for fabricating a deep submicron MOSFET featuring a self-aligned local threshold voltage adjust region in a semiconductor substrate with the threshold voltage U.S. Pat. No. 5,801,075 to Gardner et al. describes a method of forming an insulated gate FET using metal spacers to form a channel length significantly smaller than the trench length.

SUMMARY OF THE INVENTION

Accordingly, it is an object of the present invention to provide a method of forming a FET with a self-aligned channel implant.

Another object of the present invention is to provide a method of forming a FET having an elevated source and drain, and having a self-aligned channel implant.

Other objects will appear hereinafter.

It has now been discovered that the above and other objects of the present invention may be accomplished in the following manner. Specifically, a method of forming a FET with an having a self-aligned pocket implant, comprising the following steps. A substrate is formed having a substrate dielectric layer thereon and a first oxide layer over the substrate dielectric layer. The first oxide layer having an upper surface. A trench is formed through the oxide layer, the substrate dielectric layer, and partially through the substrate. The trench having a bottom and side walls. A second oxide layer is formed along the bottom and said side walls of said trench within the substrate. A dopant is selectively ion implanted into the substrate is achieved to form lightly doped layers adjacent the side walls of the trench within the substrate. A self-aligned channel implant and a pocket implant are ion implanted at predetermined respective depths in the substrate below the trench bottom is achieved. Side-wall spacers on the side walls of the trench are then formed with the side-wall spacers each having a top surface below the upper surface of the first oxide layer. A gate dielectric layer is formed on the bottom of the trench between the side-wall spacers. A planarized gate electrode is formed that has an upper surface substantially coextensive with the upper surface of the first oxide layer. The first oxide layer and the substrate dielectric layer are removed. A dopant is ion implanted into the substrate to form heavily doped layers adjacent the side wall spacers. In an alternate embodiment, inter alia, the LDD source and drain portions are formed after HDD source and drain portions formation and after the side-wall spacers are removed.

BRIEF DESCRIPTION OF THE DRAWINGS

The features and advantages of the method of forming a FET device having a self-aligned channel input according to the present invention will be more clearly understood from the following description taken in conjunction with the accompanying drawings in which like reference numerals designate similar or corresponding elements, regions and portions and in which:

FIGS. 3–5A, and 5B, show in cross-sectional views the method of forming a FET device having a self-aligned channel input according to one embodiment of the present invention.

DETAILED DESCRIPTION OF THE PREFERRED EMBODIMENT

Figure 1:
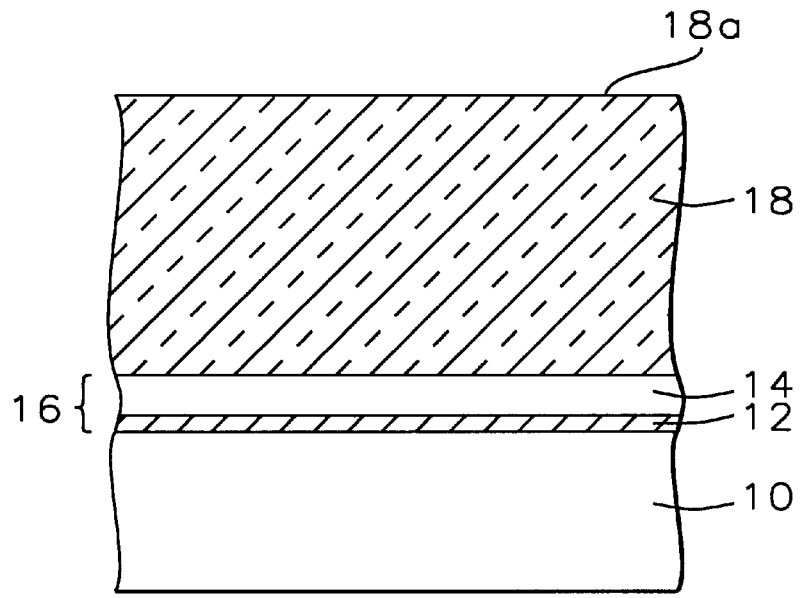
FIGS. 1 and 2 show in cross-sectional views the initial steps of forming a FET device having a self-aligned channel input according to embodiments of the present invention.
Figure 2:
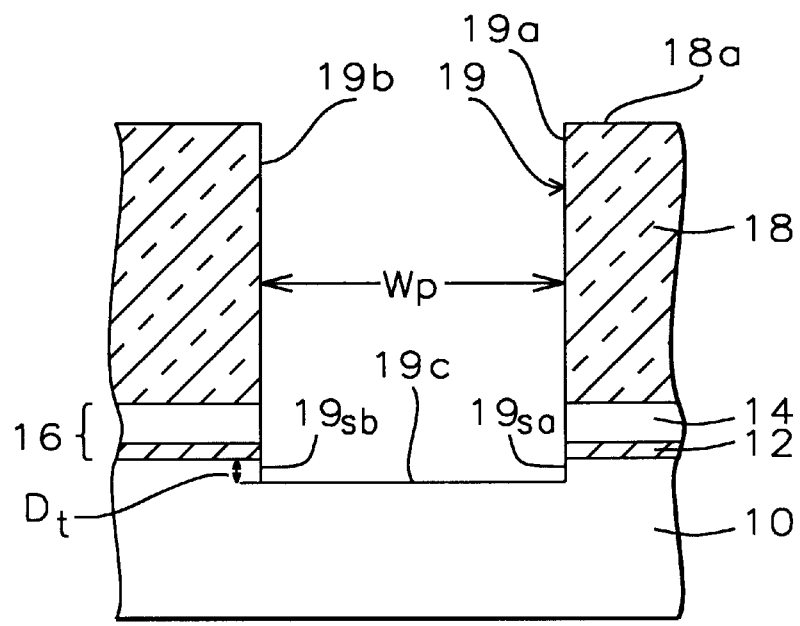

Accordingly as shown in FIG. 1, substrate 10 has formed thereon a substrate dielectric layer 16 comprising a lower SiO layer 12 (oxide layer) and an upper SiN or SiON layer 14. Unless otherwise specified, all structures, layers, etc. may be formed or accomplished by conventional methods known in the prior art. Dielectric layer 16 has formed thereon a first oxide layer 18 having an upper surface 18a. As shown in FIG. 2, trench 19 is formed by etching through first oxide layer 18, dielectric layer 16, and partially into substrate 10. Since trench 19 is partially within substrate 10, this will allow an elevated source and drain to be formed higher than the gate region. So, in the silicide 34a, 34b formation, some silicon in the higher source/drain region will be consumed.

Trench 19 has side walls 19a and 19b and bottom 19c. The portion of side walls 19a and 19b that extend into substrate 10 are 19sa and 19sb. The depth $D_t$ which trench 19 penetrates substrate 10, is from about 50 to 500 Å and more preferable 200 Å. Trench width $W_p$ is the widened poly width and is equal the width of the poly plus twice the width of a side-wall spacer (to be formed hereafter.)

Figure 3:
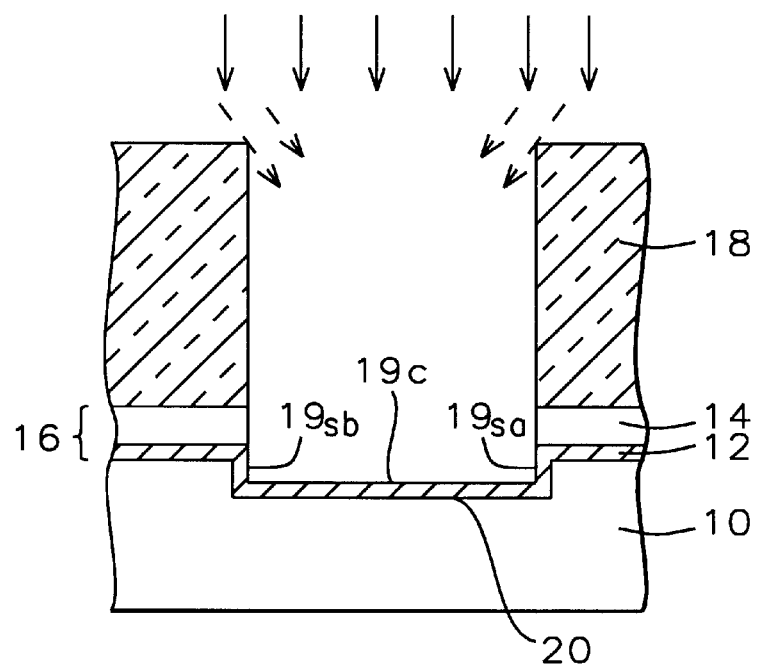

As shown in FIG. 3, in the first embodiment, second oxide layer 20, having a thickness of from about 15 to 200 Å and more preferably 150 Å, is then formed along the bottom 19c and side wall portions 19sa and 19sb of trench 19 within substrate 10. Lightly doped drain (LDD) 26a and LDD source 26b are then formed by selective ion implantation by a tilt angle method, or the like, so that drain 26a and source 26b are adjacent to, and extend laterally from, either side wall portion 19sa and 19sb. The LDD ion implantation (for NMOS arsenic (As) ions are preferably used) is conducted at an energy of from about 5 to 50 keV and at a dose of from about 1E12 to 1E14 atoms/cm³ and more preferably at an energy of 30 keV and at a dose of 5E13 atoms/cm³.

Figure 4:
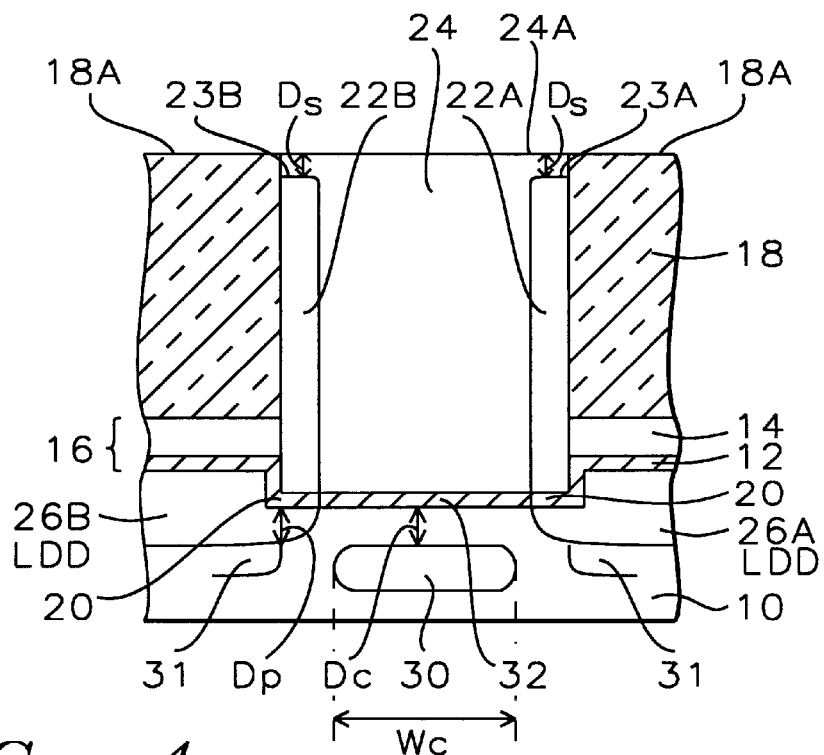

A self-aligned channel implant 30 and self-aligned pocket implant 31 are then formed within substrate 10 by ion implantation. The channel implant 30 ion implantation is conducted at an energy of from about 15 to 90 keV and at a dose of from about 1E11 to 1E14 atoms/cm³ and more preferably at an energy of 80 keV and at a dose of 1E12 atoms/cm³. As shown in FIG. 4, channel implant depth $D_c$ from trench bottom 19c is from about 100 to 2000 Å and more preferably 800 Å. Pocket implant 31 ion implantation is conducted at an energy of from about 30 to 200 keV and at a dose of from about 1E12 to 1E14 atoms/cm³ and more preferably at an energy of 120 keV and at a dose of 1E13 atoms/cm³. Pocket implant depth $D_p$ from trench bottom 19c is from about 100 to 2000 Å and more preferably 650 Å. Channel implant 30 has a width $W_c$ essentially equal to the device width or poly width. For an NMOS type device, for example, having N-type source/drain, channel implant 30 and pocket implant 31 are doped with a P-type dopant, i.e. opposite to the source/drain type dopant.

As shown in FIG. 4, side-wall spacers 22a and 22b are then formed by a deposition and etching within trench 19. The upper surfaces 23a and 23b of side-wall spacers 22a and 22b, respectively, are lower than remaining upper surface 18a of first oxide layer 18 due to over etching. Etching to form side-wall spacers 22a and 22b also removes that portion of second oxide layer 20 between side-wall spacers 22a and 22b (not shown). Gate dielectric 32 is formed between side-wall spacers 22a and 22b on trench bottom 19c replacing the second oxide layer 20 removed during the etching process that formed side-wall spacers 22a and 22b.

Gate dielectric 32 has a thickness of from about 10 to 100 Å and more preferably 20 Å. Gate dielectric 32 is thinner than previous gate dielectrics and provides enhanced gate control ability and a reduction in the short channel effect.

Poly silicon (poly or poly Si) is then deposited filling trench 19 between side-wall spacers 22a and 22b and above gate dielectric 32 and planarized by chemical-mechanical polishing (CMP) to form gate electrode 24 having upper surface 24a that is substantially level with remaining upper surface 18a of first oxide layer 18. The depth $D_s$ of upper surfaces 23a and 23b of side-wall spacers 22a and 22b, respectively, beneath upper surface 24a of gate electrode 24 is from about 500 to 3000 Å and more preferably 1800 Å. This will aid in the subsequent silicide formation as discussed hereafter.

Figure 5A:
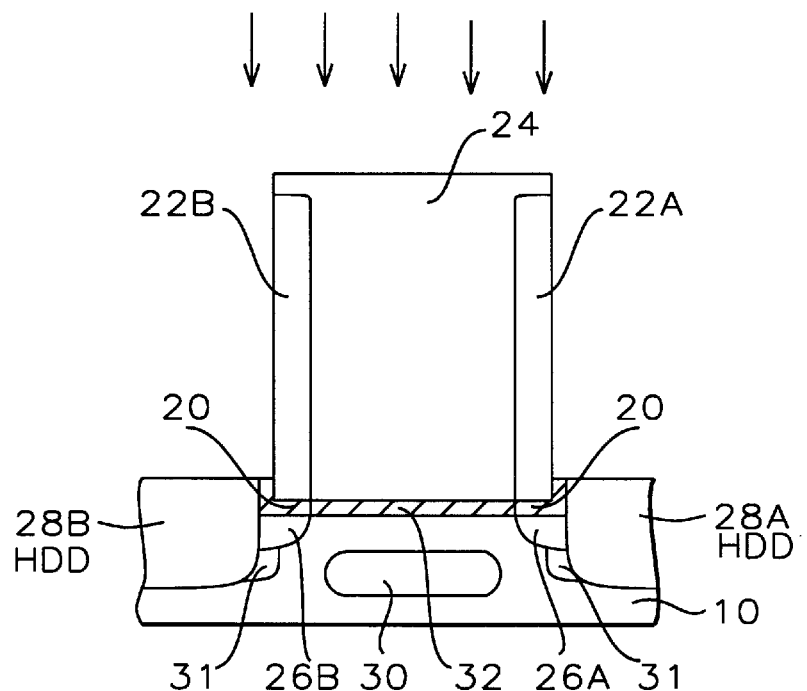

As shown in FIG. 5A, first oxide layer 18 and substrate dielectric layer 16 are removed and then heavily doped drain (HDD) and HDD source portions 28a and 28b, respectively, are formed by ion implantation with gate electrode 24, with remaining vertical wall portions of second oxide layer 20, and side-wall spacers 22a and 22b acting as masks so that HDD drain and source portions 28a and 28b are adjacent to remaining LDD drain 26a portion and LDD source 26b portion and extend laterally therefrom. The HDD ion implantation is conducted at an energy of from about 15 to 100 keV and at a dose of from about 1E13 to 1E16 atoms/cm³ and more preferably at an energy of 50 keV and at a dose of 1E15 atoms/cm³.

Figure 5B:
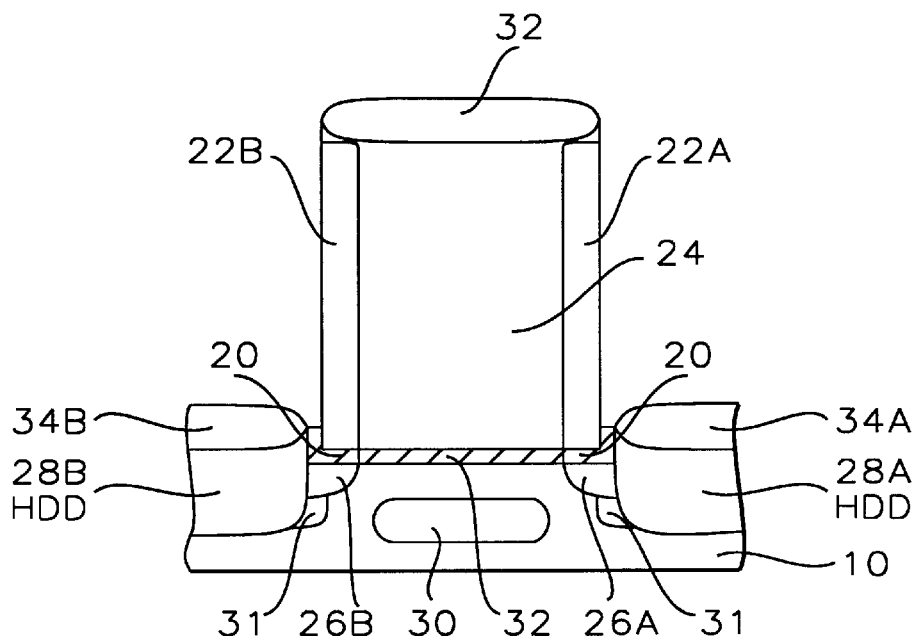

As shown in FIG. 5B, silicide portions 32, 34a, and 34b are simultaneously formed over gate electrode 24 and either HDD drain 28a and HDD source 28b, respectively, by a salicide process. Silicide portions 32, 34a, and 34b are preferably TiSi$_x$, and may be CoSi$_x$ or NiSi$_x$ for example.

Another embodiment, the preferred embodiment, is shown in FIGS. 1, 2 and 6–9. This second embodiment differs from the first embodiment, inter alia, in that the LDD source and drain portions are formed after HDD source and drain portion formation and after the side-wall spacers are removed. The structure shown in FIG. 2 is the starting point for formation of the second embodiment device.

Figure 6:
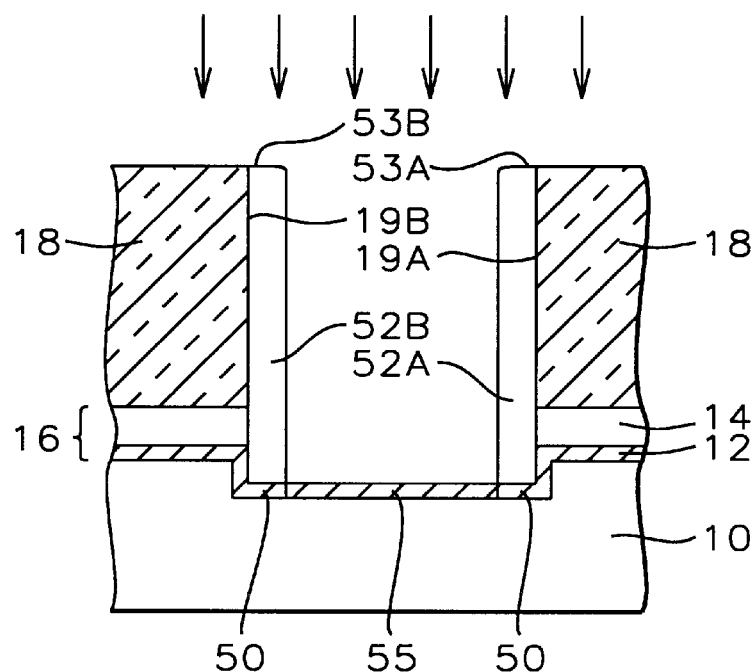
FIGS. 6–9 show in cross-sectional views the method of forming a FET device having a self-aligned channel input according to another embodiment of the present invention.

As shown in FIG. 6, for the second embodiment, second oxide layer 50, having a thickness of from about 15 to 200 Å and more preferably 150 Å, is then formed along the bottom 19c and side wall portions 19sa and 19sb of trench 19 within substrate 10. Side-wall spacers 52a and 52b are then formed by a deposition and etching within trench 19. In this second embodiment, the upper surfaces 53a and 53b of side-wall spacers 52a and 52b, respectively, are substantially level with remaining upper surface 18a of first oxide layer 18. Etching to form side-wall spacers 52a and 52b also removes that portion of second oxide layer 50 between side-wall spacers 52a and 52b (not shown).

A self-aligned channel implant 60 is then formed within substrate 10 by ion implantation. The channel implant 60 ion implantation is conducted at an energy of from about 15 to 90 keV and at a dose of from about 1E11 to 1E14 atoms/cm³ and more preferably at an energy of 80 keV and at a dose of 1E12 atoms/cm³. As shown in FIG. 4, channel implant depth $D_c$ from trench bottom 19c is from about 100 to 2000 Å and more preferably 800 Å. Channel implant 60 has a width $W_c$ essentially equal to the device width. The width of channel implant 60 is less than the width of channel implant 30 in the first embodiment Gate dielectric 55 is formed between side-wall spacers 52a and 52b on trench bottom 19c replacing the second oxide layer 50 formerly therein removed during the etching process that formed side-wall spacers 52a and 52b. Gate dielectric 55 has a thickness of from about 10 to 100 Å and more preferably 20 Å.

Figure 7:
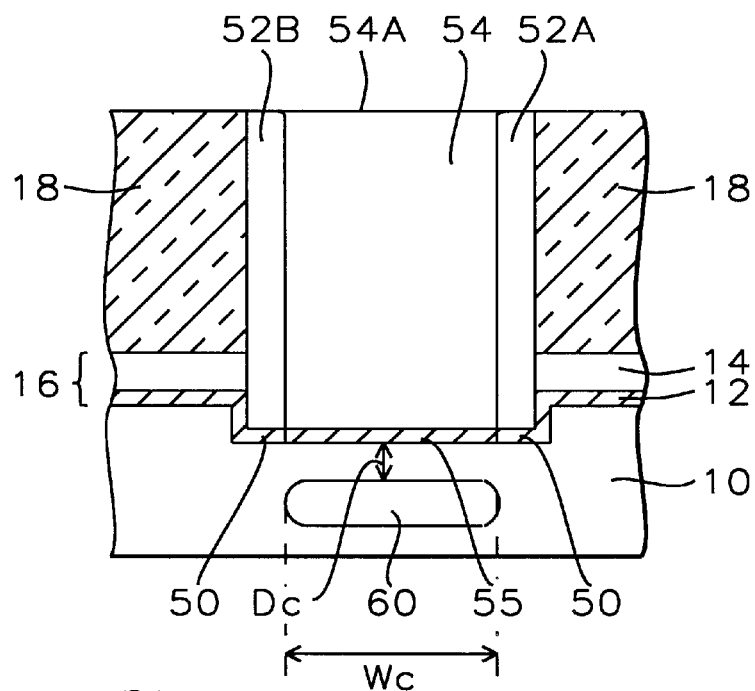

As shown in FIG. 7, poly silicon (poly or poly Si) is then deposited filling trench 19 between side-wall spacers 52a and 52b and above gate dielectric 55 and planarized by chemical-mechanical polishing (CMP) to form gate electrode 54 having upper surface 54a that is substantially level with upper surfaces 53a and 53b of side-wall spacers 52a and 52b, respectively.

Figure 8:
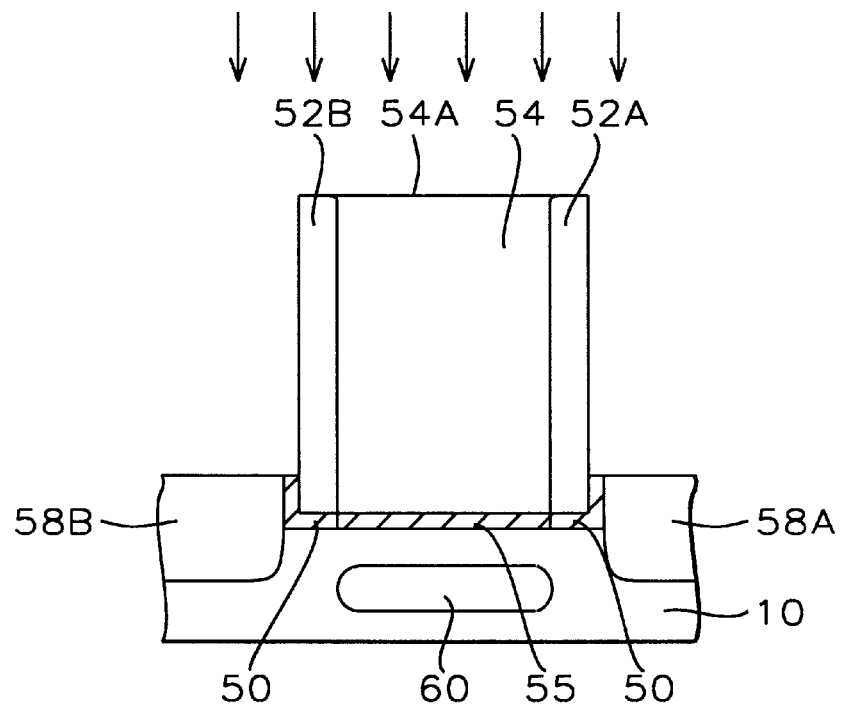

As shown in FIG. 8, first oxide layer 18 and substrate dielectric layer 16 are removed and then heavily doped drain (HDD) and HDD source portions 58a and 58b, respectively, are formed by ion implantation with gate electrode 54, with remaining vertical wall portions of second oxide layer 50, and side-wall spacers 52a and 52b acting as masks so that HDD drain and source portions 58a and 58b are adjacent to side-wall spacers 52a and 52b and either remaining vertical wall portions 50a, 50b of second oxide layer 50 and extend laterally therefrom. The HDD ion implantation is conducted at an energy of from about 15 to 100 keV and at a dose of from about 1E13 to 1E16 atoms/cm$^3$ and more preferably at an energy of 50 keV and at a dose of 1E15 atoms/cm$^3$.

Figure 9:
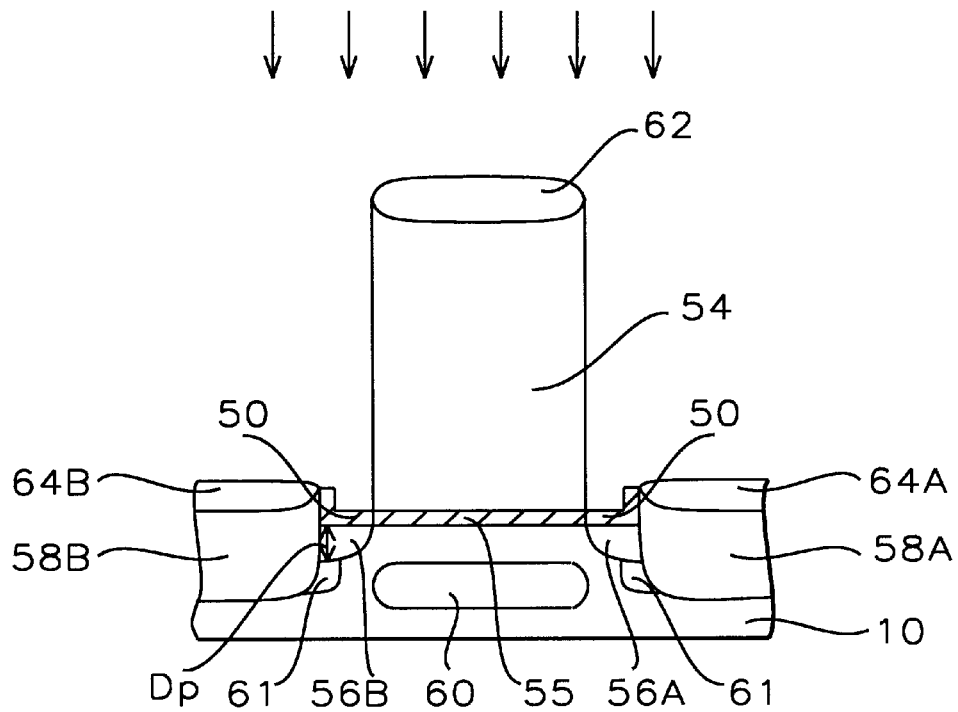

As shown in FIG. 9, silicide portions 62, 64a, and 64b are simultaneously formed over gate electrode 54 and either HDD drain 58a and HDD source 58b, respectively, by a salicide process. Silicide portions 62, 64a, and 64b are preferably TiSi$_x$, and may be CoSi$_x$ or NiSi$_x$ for example. Side-wall spacers 52a and 52b are then removed leaving remaining second oxide layer portions 50.

Lightly doped drain (LDD) 56a and LDD source 56b, and self-aligned pocket implant 61, are then formed in substrate 10 by ion implantation with gate electrode 54 and silicide portions 62, 64a, and 64b acting as masks, so that drain 26a and source 26b are adjacent to, and extend laterally from, either side of gate electrode 54 to HDD drain 58a and HDD source 58b, respectively. The LDD ion implantation is conducted at an energy of from about 5 to 50 keV and at a dose of from about 1E12 to 1E14 atoms/cm$^3$ and more preferably at an energy of 20 keV and at a dose of 3E13 atoms/cm$^3$. Pocket implant 61 ion implantation is conducted at an energy of from about 30 to 200 keV and at a dose of from about 1E12 to 1E14 atoms/cm$^3$ and more preferably at an energy of 120 keV and at a dose of 1E13 atoms/cm$^3$. Pocket implant depth D$_p$ from trench bottom 19c is from about 100 to 2000 Å and more preferably 650 Å. For an NMOS type device, for example, having N-type source/drain, channel implant 60 and pocket implant 61 are doped with a P-type dopant, i.e. opposite to the source/drain type dopant.

While particular embodiments of the present invention have been illustrated and described, it is not intended to limit the invention, except as defined by the following claims.

We claim:

1. A method of forming a FET having a self-aligned pocket implant, comprising the steps of:

forming a substrate having a substrate dielectric layer thereon and a first oxide layer over said substrate dielectric layer, said first oxide layer having an upper surface;

forming a trench through said first oxide layer, said substrate dielectric layer, and partially through said substrate, said trench having a bottom and side walls;

forming a second oxide layer along said bottom and said side walls of said trench within said substrate;

selectively ion implanting a dopant into said substrate to form lightly doped layers adjacent said side walls of said trench within said substrate;

ion implanting a self-aligned channel implant and a pocket implant at predetermined respective depths in said substrate below said trench bottom;

forming side-wall spacers on said side walls of said trench; said side-wall spacers each having a top surface below said upper surface of said first oxide layer;

forming a gate dielectric layer on said bottom of said trench between said side-wall spacers;

forming a planarized gate electrode having an upper surface substantially level with said upper surface of said first oxide layer;

removing said first oxide layer and said substrate dielectric layer; and ion implanting a dopant into said substrate to form heavily doped layers adjacent said side wall spacers.

2. The method of claim 1, further including the step of forming silicide portions by a salicide process over said upper surface of said gate electrode and over the upper surfaces of said heavily doped layers.

3. The method of claim 1, wherein said second oxide layer is 150 Å thick.

4. The method of claim 1, wherein said ion implanting to form lightly doped layers is conducted at an energy of 30 keV and at a dose of 5E13 atoms/cm$^3$.

5. The method of claim 1, wherein said ion implanting of said self-aligned channel implant is conducted at an energy of 80 keV and at a dose of 1E12 atoms/cm$^3$, and said ion implanting of said pocket implant is conducted at an energy of 120 keV and at a dose of 1E13 atoms/cm$^3$.

6. The method of claim 1, wherein said ion implanting to form heavily doped layers is conducted at an energy of 50 keV and at a dose of 1E15 atoms/cm$^3$.

7. The method of claim 1, wherein said depth of said channel implant is 800 Å below said bottom of said trench and said depth of said pocket implant is 650 Å below said bottom of said trench.

8. The method of claim 1, wherein formation of said lightly doped layers is conducted by tilt angle ion implantation.

9. The method of claim 1, wherein said gate dielectric layer is 20 Å thick.

10. A method of forming a FET having a self-aligned pocket implant, comprising the steps of:

forming a substrate having a substrate dielectric layer thereon and a first oxide layer over said substrate dielectric layer, said first oxide layer having an upper surface;

forming a trench through said first oxide layer, said substrate dielectric layer, and partially through said substrate, said trench having a bottom and side walls;

forming a second oxide layer along said bottom and said side walls of said trench within said substrate;

forming side-wall spacers on said side walls of said trench; said side-wall spacers each having a top surface substantially level with said upper surface of said first oxide layer;

ion implanting a self-aligned channel implant and a pocket implant at predetermined respective depths in said substrate below said trench bottom;

forming a gate dielectric layer on said bottom of said trench between said side-wall spacers;

forming a planarized gate electrode having an upper surface substantially level with said upper surfaces of said side-wall spacers;

removing said first oxide layer and said substrate dielectric layer;

ion implanting a dopant into said substrate to form heavily doped layers adjacent said side wall spacers.

forming silicide portions by a salicide process over said upper surface of said gate electrode and over the upper surfaces of said heavily doped layers;

removing said side-wall spacers; and ion implanting a dopant into said substrate to form lightly doped layers within said substrate between said gate electrode and said heavily doped layers.

11. The method of claim 10, wherein said second oxide layer is 150 Å thick.

12. The method of claim 10, wherein said depth of said channel implant is 800 Å below said bottom of said trench and said depth of said pocket implant is 650 Å below said bottom of said trench.

13. The method of claim 10, wherein said gate dielectric layer is 20 Å thick.

14. The method of claim 10, wherein said ion implanting to form said heavily doped layers is conducted at an energy of 50 keV and at a dose of 1E15 atoms/cm$^3$.

15. The method of claim 10, wherein said ion implanting to form said lightly doped layers is conducted at an energy of 20 keV and at a dose of 3E13 atoms/cm$^3$.

* * * * *